(12) United States Patent
Yang

(10) Patent No.: US 6,557,244 B1
(45) Date of Patent: May 6, 2003

(54) WAFER LEVEL BOARD/CARD ASSEMBLY APPARATUS

(76) Inventor: Wen-Kun Yang, No. 47, Lane 6, An-Kang Street, Hsinchu City (TW)

( * ) Notice: Subject to any disclaimer, the term of this patent is extended or adjusted under 35 U.S.C. 154(b) by 0 days.

(21) Appl. No.: 09/524,427

(22) Filed: Mar. 11, 2000

(30) Foreign Application Priority Data

Jan. 14, 2000 (TW) ......................................... 89100564 A

(51) Int. Cl.[7] ............................ B23P 21/00; B23P 23/00
(52) U.S. Cl. ........................ 29/705; 29/593; 29/407.01; 29/34 R; 29/564.1; 29/650
(58) Field of Search ..................... 29/407.01, 407.04, 29/593, 34 R, 705, 563, 832, 564.1, 833, 834, 564.7, 839, 650, 840, 739, 740, 741, 742, 759, 760; 228/179.1; 361/760

(56) References Cited

U.S. PATENT DOCUMENTS 4,654,964 A * 4/1987 Schneider et al. ........ 29/407.01
5,640,762 A * 6/1997 Farnworth et al. ........ 29/407.01
6,008,636 A * 12/1999 Miller et al. ............. 324/158.1
6,148,511 A * 11/2000 Taguchi ........................ 29/739
6,158,119 A * 12/2000 Crist et al. .................... 29/840

* cited by examiner

Primary Examiner—Timothy V. Eley

(57) ABSTRACT

An integrated wafer level board/card assembly method combines wafer level packaging, testing and assembly process. The integrated process includes the steps of first wafer sorting, laser repairing, second wafer sorting, wafer level burn-in, wafer level packaging, final testing, wafer sawing and board/card assembly. Information including wafer mapping and yield data of a process step is used as the input data to a next process step. Burn-in circuits and internal probing pads are built in the dice of the wafer to enable wafer level burn-in. A wafer cassette is used to move wafers between steps. Probers are used as the primary equipment in many steps to provide automatic wafer loading and testing. A multi-chip module die bonder, an IR re-flow system and an open/short tester form an automatic in-line system to accomplish the step of assembling a plurality of integrated circuit chips on a PC board.

11 Claims, 6 Drawing Sheets

WAFER LEVEL BOARD/CARD ASSEMBLY APPARATUS

FIELD OF THE INVENTION

The present invention relates generally to a method of wafer level packaging and testing, and more specifically to a wafer level board/card assembly process.

BACKGROUND OF THE INVENTION

The advance of semiconductor technology in recent years has greatly increased the density of a semiconductor device. In order to satisfy the strong market demand of highly portable and compact electronic gadgets, many semiconductor manufacturers are dedicated to the fabrication of integrated circuits with densely populated semiconductor devices, a large number of input/output (I/O) terminals and fast processing speed. After the fabrication of integrated circuits on a wafer, each die on the wafer needs to be properly tested and packaged to prevent it from being damaged by moisture or external forces.

As the number of I/O pins and the processing speed of a circuit device-increase, the technology of packaging the die becomes more and more critical. How to package a large number of pins in a small volume and maintain the high processing speed of the device have to be carefully considered. In addition, the issue of heat dissipation from the high density circuit must be addressed. After each die is packaged, the circuit on the die has to be tested to ensure that it functions properly as designed.

In general, the conventional wafer testing procedure includes primarily first wafer sorting, laser repairing, second wafer sorting and burn-in. The first three steps are performed in the wafer level. The step of burn-in is performed after the wafer is sawed and each die has been cut off from the wafer, sealed and packaged as an individual integrated circuit.

The first wafer sorting is to test if there are problems in the wafer fabrication process that result in malfunction of the integrated circuit in a die. The step of laser repairing is usually used to repair the defective storage units in memory devices such as DRAM or SRAM. After the laser repairing, the second wafer sorting is used to examine if the repairing has been accomplished successfully. The repaired dice are tested to determine if they function properly as designed. In generally, only one or two wafers from a cassette of 25 or 50 wafers are sampled and tested.

In the conventional packaging technology, each individual die sealed and assembled as an integrated circuit in a package such as TSOP, SOJ, QFP and BGA, . . . , etc. is under burn-in on a test socket separately. Different test sockets are required for testing the devices that have different types of packages. The purpose of the burn-in process is to identify and remove the devices that suffer from infant mortality.

The conventional burn-in technology relies on a burn-in system that sends signals to directly control the integrated circuit. During a test cycle, 50% of the duty cycle is used and only one address bit can be controlled. Most of the tests use write cycle only. Therefore, the burn-in process may take several hours to several days to complete. Because of the inefficiency, a packaged integrated circuit spends a long time on a burn-in board that sometimes causes the pins of the circuit to be bent and damaged. Both the burn-in boards and burn-in sockets do not last very long.

As a result, the cost associated with the burn-in step is high. In addition, if the burn-in step detects defects caused by a wafer process problem, the problem is uncovered only after many integrated circuits have been packaged and many wafers have been fabricated. Therefore, there is a strong demand in having a better wafer packaging, testing and assembly process that can uncover the defects and reflect the wafer process problem as early as possible to reduce the cost and improve the yield of manufacturing integrated circuits.

SUMMARY OF THE INVENTION

The present invention has been made to overcome the above-mentioned drawbacks of conventional wafer packaging and testing techniques. The primary object of the invention is to combine semiconductor chip packaging, testing and assembly into an integrated process performed at wafer level. The integrated wafer level process reduces the frequency of loading and unloading wafers and increases the throughput of manufacturing the semiconductor chips.

Another object of the invention is to provide an automatic in-line process for wafer level board/card assembly. According to this invention, the automatic wafer level board/card assembly process comprises first wafer sorting, laser repairing, second wafer sorting, wafer level burn-in, wafer level packaging, final testing, wafer sawing, and board/card assembly. The output data such as wafer mapping and yield data of each process step are sent to a computer server and used as the input data to the next process step.

It is also an object of the invention to provide a wafer level burn-in method for the integrated assembly process. A burn-in circuit and a plurality of internal probing pads are built in the circuit of the integrated circuit chip manufactured by the process of this invention. By using a prober and a probe card, appropriate voltages and control signals can be provided to the integrated circuit of each die at wafer level to put the circuit device under burn-in. Multiple dice can be under burn-in at the same time. The burn-in time is reduced from several days to several seconds.

It is yet another object of the invention to provide a board/card assembly process for the final assembly of a PC board and integrated chips. According to the invention, the dice are packaged on the wafer. After the wafer level packaging, the wafer is sawed to separate the packaged integrated chips. A multi-chip module die bonder, an IR re-flow machine and an open/short tester are used to assemble, test and sort the board/card to produce the chip product.

In the present invention, many of the process steps are performed with a tester and a prober. Wafers are transported from one step to a next step in a wafer cassette. Automatic wafer loading, wafer alignment and wafer unloading are provided by the existing prober. The wafer mapping, bin/yield data and repairing data of each process step can be sent to the computer server by the tester/prober. The computer server can also load testing programs and setup the tester.

Accordingly, it is yet an object of the invention to provide an automatic integrated in-line process system connected to the world wide internet. The output information at each process step can be transmitted to a client in real time. Test results from wafer sorting or testing can be used to uncover wafer process problem early and improve the yield of manufacturing the wafer and the integrated circuit chips.

The foregoing and other objects, features, aspects and advantages of the present invention will become more apparent from a careful reading of a detailed description provided herein below, with appropriate reference to the accompanying drawings.

DETAILED DESCRIPTION OF THE PREFERRED EMBODIMENTS

The present invention combines the process of packaging, testing and assembling integrated circuit chips into an integrated automatic in-line process performed at wafer level. The steps of sorting, laser repairing, packaging, burn-in, final testing, and board/card assembly are processed in the wafer level integrated process controlled and automated by computers.

Figure 1:
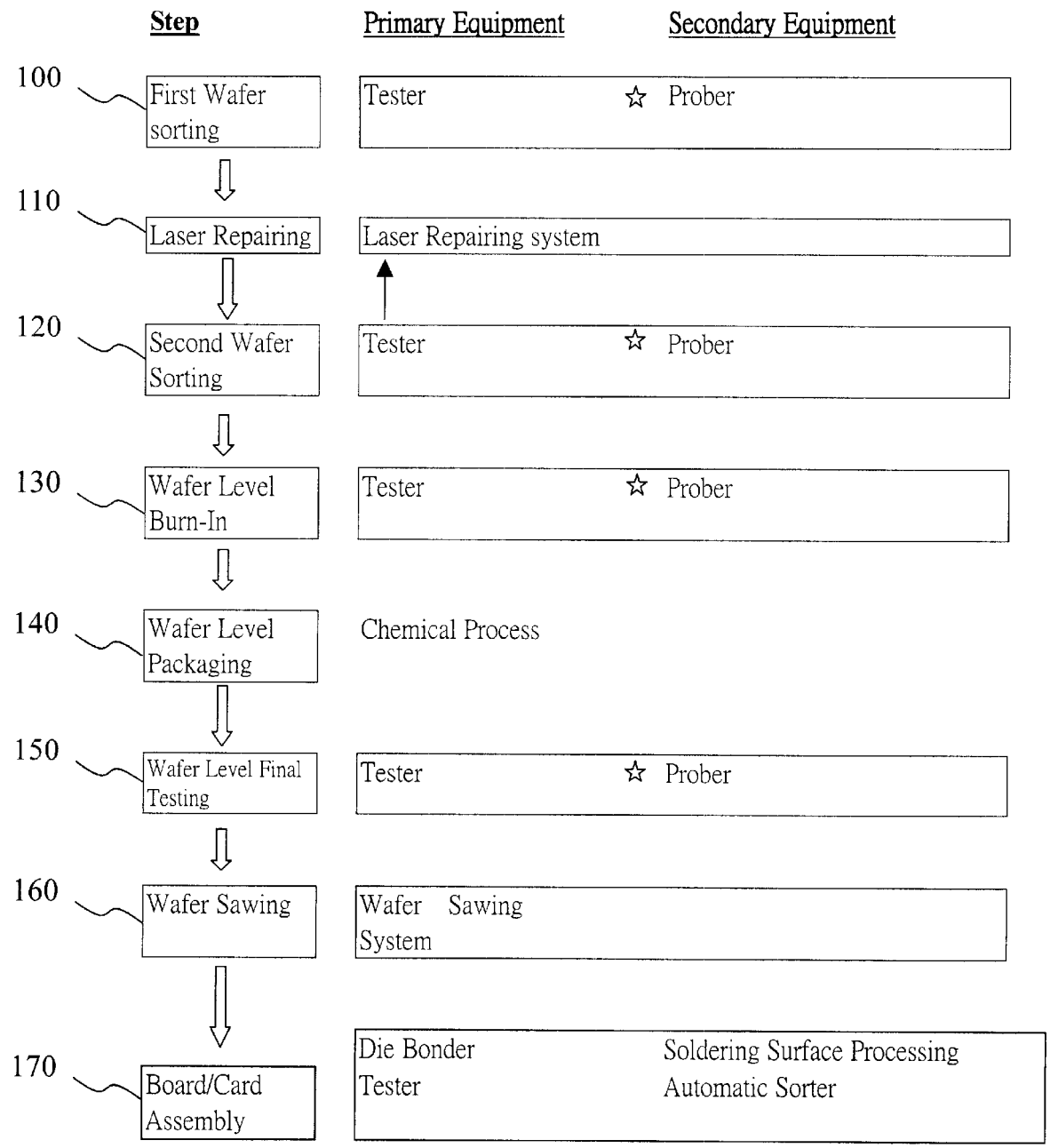
FIG. 1 illustrates the flow chart of the wafer level sorting, repairing, testing, packaging and board/card assembly process according to the present invention.

With reference to FIG. 1, the wafer level board/card assembly process of this invention includes first wafer sorting 100, laser repairing 110, second wafer sorting 120, wafer level burn-in 130, wafer level packaging 140, wafer level final testing 150, wafer sawing 160 and board/card assembly 170.

The first wafer sorting 100 is to test if there are problems in the wafer fabrication process that result in malfunction of the integrated circuit in the dice. For a memory device, the sorting step is also used to determine if there are defective storage units. The major setup and equipment include a tester, a prober and a probe card. A cassette of wafers (normally 25 wafers) can be put on a prober and each wafer is loaded, aligned, tested and unloaded automatically. The output data of the first wafer sorting 100 are wafer mapping, bin/yield, and repairing data.

The step of laser repairing 110 is usually used to repair the defective storage units in memory devices such as DRAM or SRAM. Stand-by cells can be used to replace the defect storage units using the laser repairing technology. The primary equipment is a laser repairing system. A cassette of wafers can also be put on the repairing system and each wafer to be repaired is loaded, aligned, repaired and unloaded automatically according to the repairing data obtained from the first wafer sorting step 100. The output data of the laser repairing 110 are wafer mapping and repairing yield.

After the laser repairing 110, the second wafer sorting 120 is used to examine if the repairing has been accomplished successfully. The repaired dice are tested to determine if they function properly as designed. In generally, only one or two wafers from a cassette of 25 or 50 wafers are sampled and tested. The setup and equipment are the same as that required in the first wafer sorting 100. The output data of the second wafer sorting 120 are also similar to the first wafer sorting 100.

According to the invention, the burn-in process of an integrated circuit is performed at wafer level. As shown in FIG. 1, after the second wafer sorting 120, wafer level burn-in 130 is performed in the integrated process of this invention. The purpose of the burn-in process is to identify and remove the circuit devices that may suffer from infant mortality. In order to perform wafer level burn-in, the present invention provides a burn-in circuit that can be built in an integrated circuit to facilitate the burn-in process. In addition, internal probing pads are designed and fabricated in the integrated circuit. In general, approximately 12 to 15 internal probing pads are required.

During the wafer level burn-in 130, an integrated circuit is put in a special burn-in mode and provided with appropriate voltages and control signals through the internal probing pads. A specific probe card is designed to provide the voltages and control signals for a given integrated circuit chip. The burn-in circuit in the integrated circuit is programmed to perform the wafer level burn-in 130 for the circuit device. The burn-in process can be done on a prober. A burn-in system is designed to provide the user interface and the control of the burn-in process.

By designing a probe card with sufficient number of probing pins for providing voltages and control signals to multiple dice, the wafer level burn-in 130 of the present invention can be performed in parallel on a large number of dice. For example, 32 or 64 dice can be put under burn-in at the same time. The burn-in system of the invention is a simple computer-based control system that does not involve wafer or chip handling and can be designed and built with low cost. The output data of the wafer level burn-in 130 are wafer mapping, bin/yield and repairing data.

The burn-in process of the invention also has another important advantage in that a wafer process related problem can be uncovered much earlier as compared to the conventional burn-in process which is done after a die has been packaged as an individual chip. Because the burn-in is performed at wafer level, the output data of the burn-in process can be used to identify and correct wafer process problems to improve the yield before a large number of wafers have been fabricated.

For a memory device the burn-in process of the invention can stress both a word line and a bit line at the same time. Therefore, the devices after burn-in have higher reliability and quality. The wafer product can be tracked easily because the output data of the burn-in process includes wafer mapping. The probe card of this invention does not require an extremely large number of probing pins because each die under test only requires a few probing pins. The cost of the probe card is relatively low. Most importantly, the burn-in time is reduced from several days to less than a minute.

As shown in FIG. 1, wafer level packaging 140 is the step after the wafer level burn-in 130 in the integrated wafer level process of the invention. In the conventional packaging technology, a wafer is sawed and diced before each individually die is packaged. In recent years, technologies of packaging integrated circuits on a wafer have been developed. The invention also provides a wafer level packaging technique to package the dice on a wafer before the wafer is sawed. A ACE-CSP and Shell Case technology is used to package a die on the wafer.

After the dice on a wafer have been packaged, it is necessary to perform wafer level final testing 150. The purpose of this testing process is to ensure that the integrated circuit functions properly and meets its design specification. In order to reduce testing time, parallel testing is usually performed. For a memory device, 32 or 64 dice can be put under test at the same time. For a logic device, two or four dice can be tested simultaneously.

The primary setup and equipment for the final testing are a tester, a prober and a probe card. The preferred probe card of this invention is a vertical style probe card such as a membrane probe card or a micro-spring probe card because the each die on the wafer has solder balls on it. The wafer final testing 150 provides higher electric performance because no wiring is required. The sorting of the device speed after testing can be represented with wafer mapping.

Accordingly, the wafer level final testing 150 does not require a special testing system. It uses an existing prober and can be fully automated. There is no die handling in the final test. No machine jam would occur. The wafer level final testing does not impose any extra tooling cost.

After the wafer level final testing 150, the wafer is sawed by the process of wafer sawing 160 as shown in FIG. 1. The sawing step uses standard sawing facility and equipment. A cut through process is used in the present invention. Before sawing the wafer, wafer back lapping process may be performed or not dependent on the need. Wafers can be fixed by tapes before sawing. For example, blue or UV taping technique can be applied.

The final step of the integrated wafer level process of the present invention is board/card assembly 170. In the conventional techniques for assembling a board or card such as a memory module, a mother board or an IC card, a surface-mount system is used to assemble integrated circuit chip packages such as a TSOP, SOJ, QFP or BGA and a PC board. The assembly process puts together and solders a couple of tested integrated circuit chips on a PC board to meet the requirement of a customer requested circuit module.

According to the present invention, a standard multi-chip module (MCM) die bonder, an IR re-flow system and an open/short tester are used for the fully integrated and automated board/card assembly 170. The substrate rack of a standard MCM die bonder is modified to handle a large PC board. The open/short tester is a low cost PC based tester for testing the gross function as well as open/short. Only one tooling set is required for the integrated board/card assembly 170 in the present invention.

Figure 2:
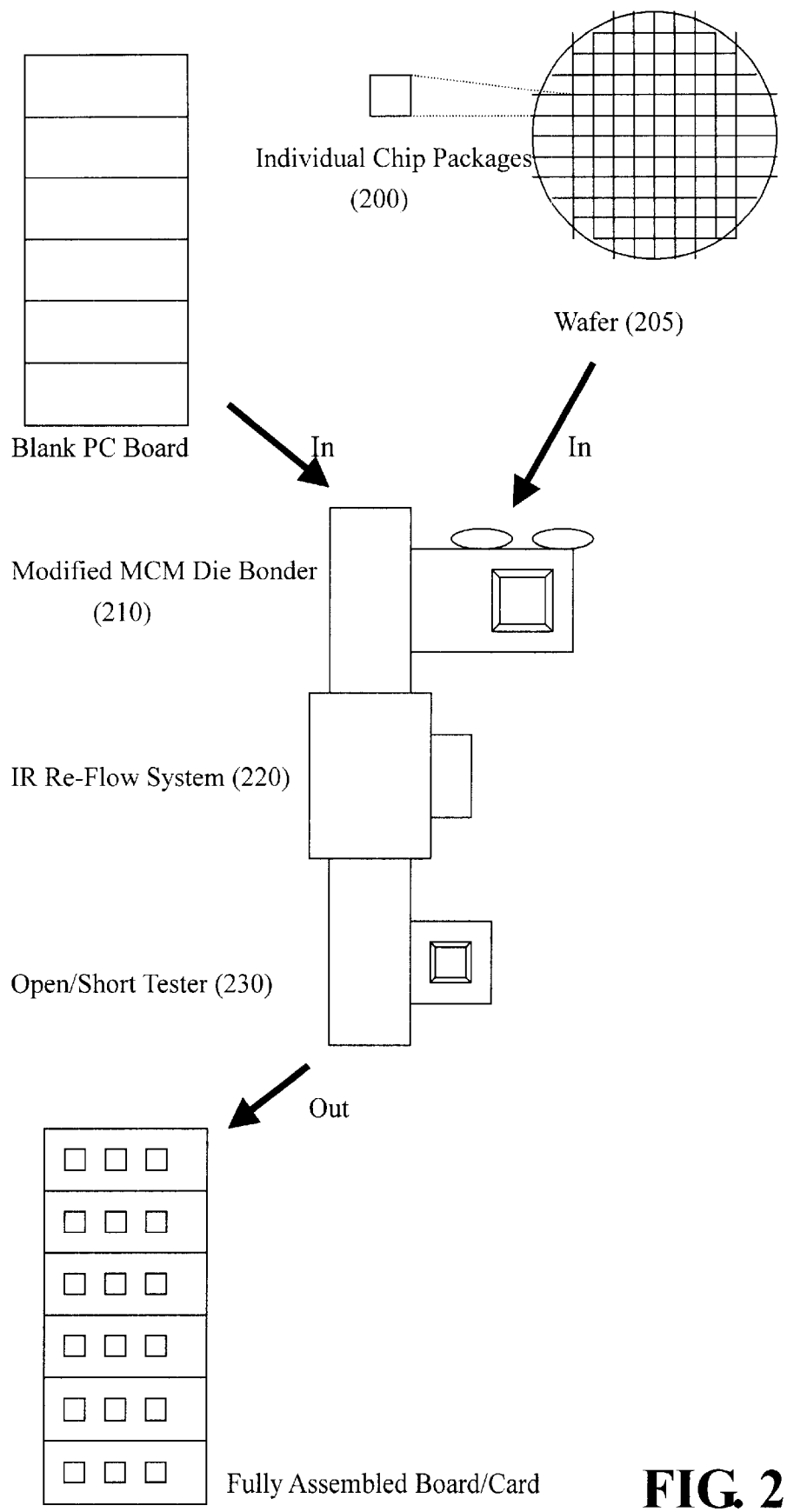
FIG. 2 illustrates the board/card assembly process for assembling a PC board with a plurality of integrated circuit chips after wafer level packaging has been completed on a wafer.

FIG. 2 illustrates the board/card assembly flow according to the invention. Individual chip packages. 200 sawed and cut off from a wafer 205 along with a blank PC board are sent to an automatic in-line system for the board/card assembly of the invention. The automatic in-line system includes a modified MCM die bonder 210, an IR re-flow system 220 and an open/short tester 230. The output of the assembly system is a fully assembled board/card with packaged integrated circuit chips on it.

Figure 3:
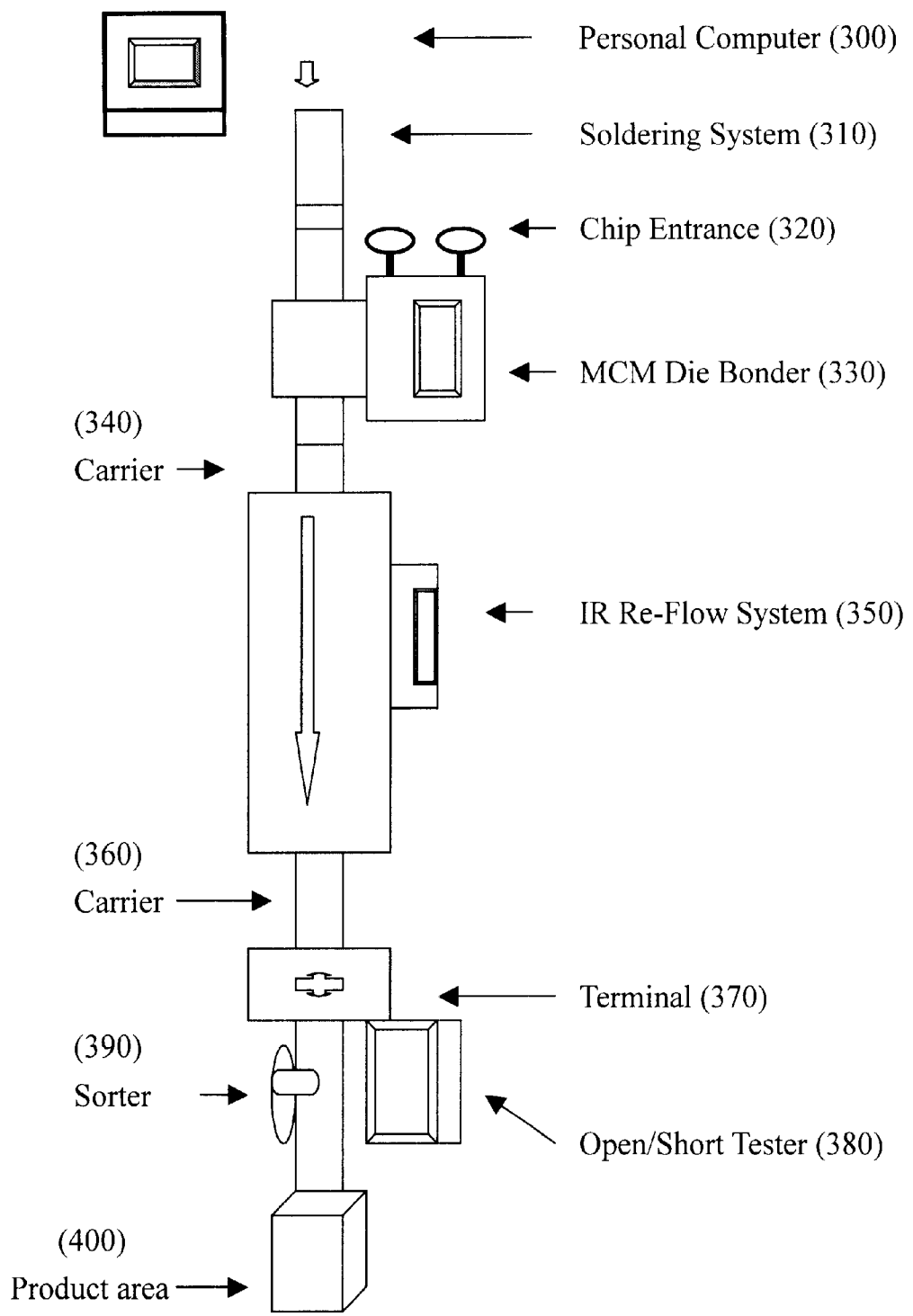
FIG. 3 illustrates the facility and equipment used to assemble a PC board and integrated chips into an assembled integrated circuit board product.

The automatic in-line board/card assembly system of the present invention is further illustrated in FIG. 3. A personal computer 300 is used to control and assist the in-line system as well as process the data. A PC board is sent to an entrance to the in-line system and applied with soldering tin by a soldering system 310. Several individually packaged chips sawed and cut off from a wafer are sent through a chip entrance 320 to an MCM die bonder 330. The chips are mounted and fixed on the PC board.

A carrier 340 carries the PC board through an IR re-flow system 350. Another carrier 360 carries the PC board from the IR re-flow system 350 to a terminal 370 of the open/short tester 380. A sorter 390 is connected to the open/short tester 380 for sorting and marking the assembled board/card with a red ink to indicate if it is defective or not. The carriers align and move the PC board according to the alignment mark designed on the PC board. The final product is sent to a product area 400. The automatic in-line system can be operated by a single person to accomplish the board/card assembly of the present invention. The system can also output wafer mapping to show how dice are packaged.

For manufacturing memory modules or cards, an optional module/card burn-in step may be included after the board/card assembly 170 shown in FIG. 1. A standard TBI (testing during burn-in) system can be used. It requires only one type of burn-in board for different chips if they are socket compatible. During the burn-in, complicated test patterns may be applied to achieve high reliability and quality. In addition, memory modules can be sorted based on burn-in board mapping during off-loading. Low cost burn-in boards can be used.

Accordingly, the computer aided wafer level board/card assembly process of this invention as shown in FIG. 1 has several advantages. Each wafer level process is performed in a prober at wafer level. Wafer cassettes are used to transfer wafers between different systems. A cassette of 25 or 50 wafers can be processed in one lot. The wafer transportation mechanism is the same as that used in the wafer fabrication process.

During the wafer level board/card assembly process, testers and probers send output data to a main computer that also loads test program and test setting to each tester. Wafer IDs are used to control the flow of the products to their destination by means of an ID reader. The input and output to each test station are controlled by the information including wafer mapping and bin/yield data. By having an inter-net connection to the system, the information may also be sent to customers through the world wide inter-net.

Figure 4A:
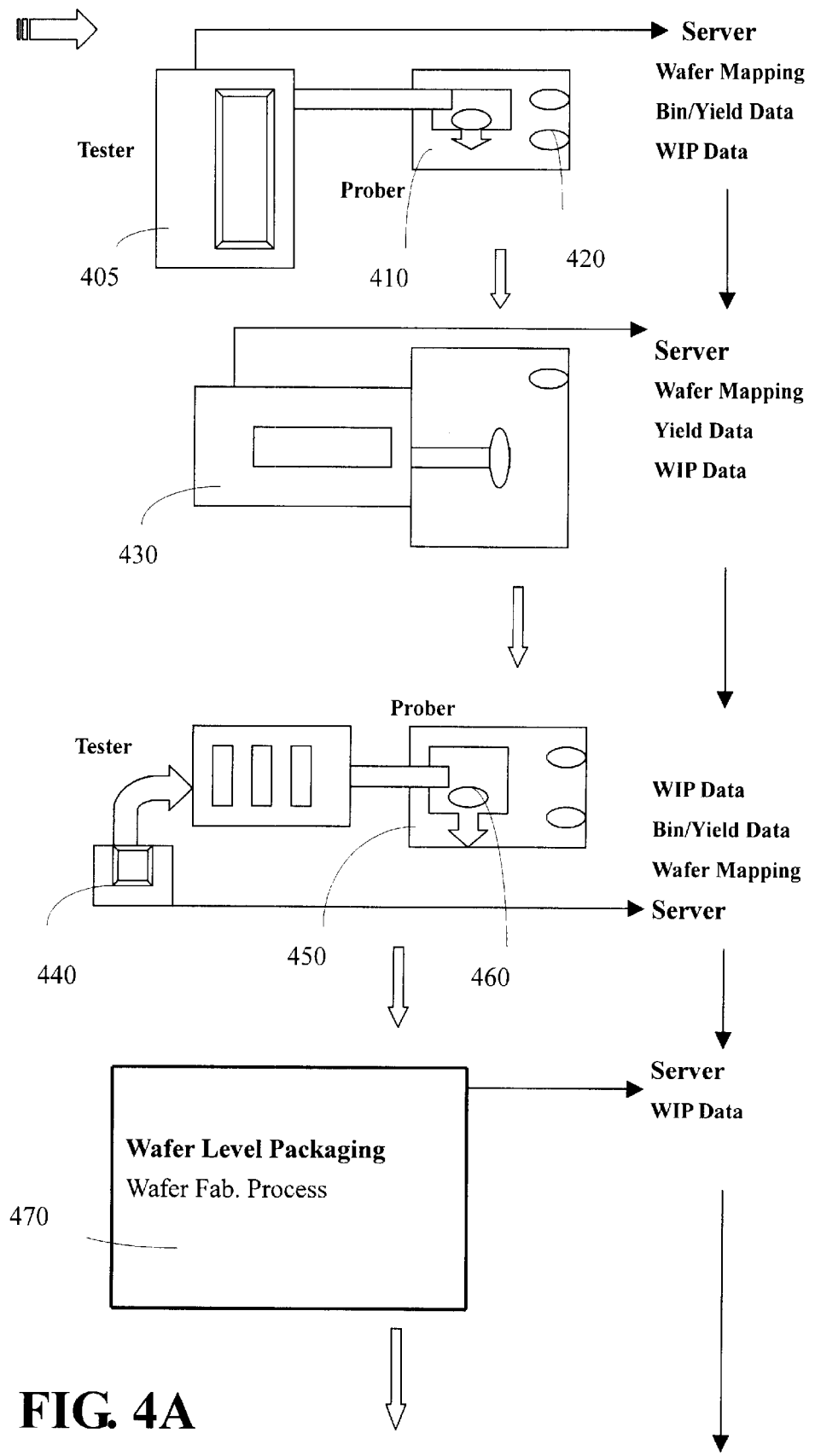
FIGS. 4A–C illustrate a complete automatic in-line apparatus for wafer level board/card assembly process according to the present invention.
Figure 4B:
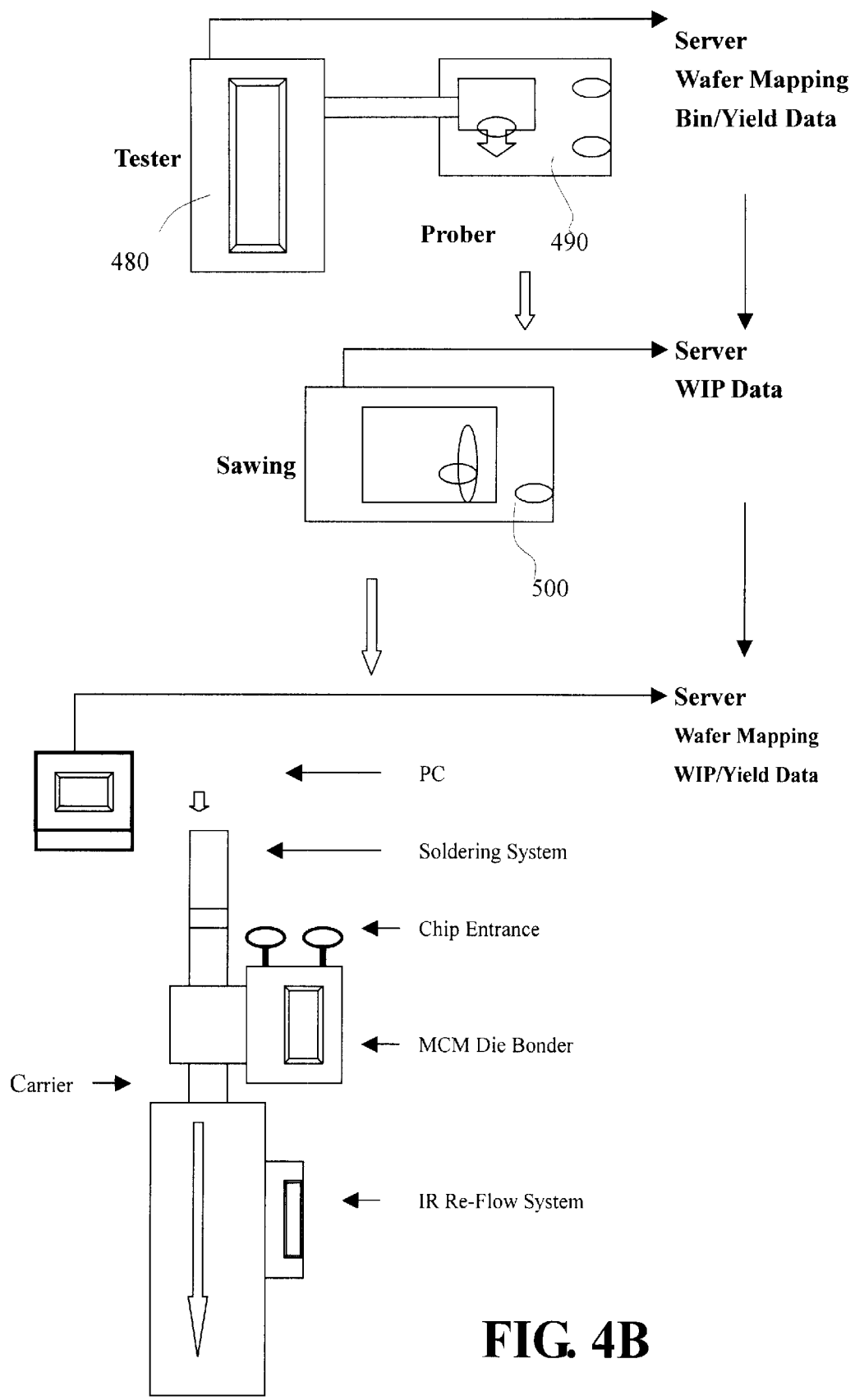
Figure 4C:
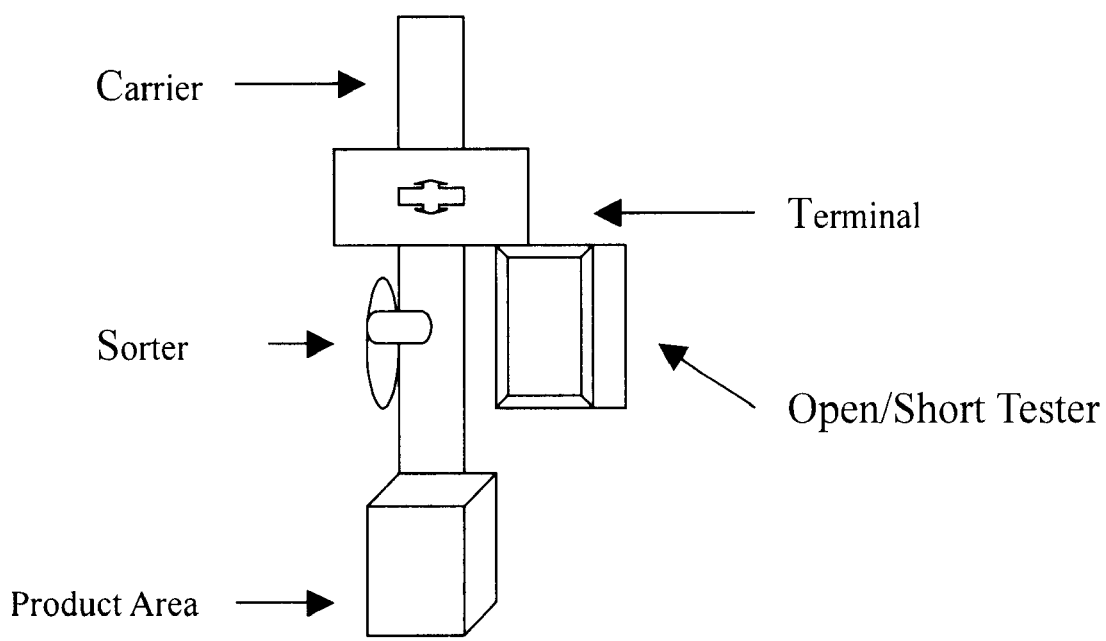

The overall system block diagram of the computer assisted manufacturing process for the wafer level board/card assembly according to the invention is shown in FIGS. 4A–C. The first wafer sorting uses a tester 405 and a prober 410 to test the functionality of dices on the wafers 420. The wafer mapping, bin/yield data and repairing data are sent to a server. After the first wafer sorting, the wafers are transported to a laser repairing system 430. Defective dice that are found in the first wafer sorting are repaired by the laser repairing system 430. The information including wafer mapping, bin/yield data and repairing yield is also sent to the server by the laser repairing system 430.

The wafers are then transported to the next station that performs second wafer level sorting. A tester 440 and a prober 450 are used in the second wafer sorting to test functionality of dices on the wafers 460. The wafer mapping, bin/yield data and repairing data are sent to a server. After the second wafer sorting, dice on the wafers are under wafer level burn-in controlled by a wafer burn-in system. The information including wafer mapping, bin/yield data and repairing data is also sent to the server.

The wafers are transported to a wafer level packaging system 470. The information generated after the packaging is also transmitted to the server. After the wafer level packaging, the wafers go through the final testing which is performed by a tester 480 and a prober 490. The information including wafer mapping, bin/yield data and repairing data is again sent to the server. After the final testing, wafers are sawed by a wafer sawing system 500. The final stage of the wafer level board/card assembly is done by an automatic in-line system that has been illustrated in FIG. 3 and described earlier.

Although only the preferred embodiments of this invention were shown and described in the above description, numerous changes in the detailed construction and combination as well as arrangement of parts may be restored to without departing from the spirit or scope of the invention as hereinafter set forth in the appended claims. It is requested that any modification or combination that comes within the spirit of this invention be protected.

What is claimed is:

1. An apparatus for wafer level board/card assembly, comprising:

a PC board input mechanism for receiving a PC board;

a soldering device for applying soldering tin on said PC board;

an integrated circuit chip input mechanism for receiving at least one integrated circuit chip;

a multi-chip module bonder for mounting and fixing said at least one integrated circuit chip to said PC board to form an assembled PC board;

an IR re-flow system for receiving said assembled PC board;

a PC board tester for receiving said assembled PC board from said TR re-flow system; and an open/short tester for receiving and testing said assembled PC board.

2. The apparatus as claimed in claim 1, said open/short tester having a sorter capable of sorting said tested assembled PC board and marking a defective assembled PC board.

3. The apparatus as claimed in claim 1, said soldering device being located in front of said PC board input mechanism.

4. The apparatus as claimed in claim 1, further comprising a PC board carrier for carrying said PC board from said multi-chip module bonder to said IR re-flow system.

5. The apparatus as claimed in claim 1, said PC board having an alignment mark for a PC board carrier to align and move said PC board.

6. The apparatus as claimed in claim 1, further comprising:

a first wafer sorting system for testing a plurality of dice on a wafer;

a laser repairing system for repairing defective dice found by said first wafer sorting system;

a second wafer sorting system for testing dice on said wafer after said wafer is repaired by said laser repairing system;

a wafer level burn-in system for performing burn-in of dice on said wafer after said wafer is tested by said second wafer sorting system;

a wafer level packaging system for packaging a plurality of dice on said wafer into a plurality of integrated circuit chips after said wafer is processed by said wafer level burn-in system;

a final testing system for testing said plurality of integrated circuit chips; and a wafer sawing machine for sawing said wafer and separating said plurality of integrated circuit chips;

wherein at least one of said plurality of separated integrated circuit chips is sent to said integrated circuit chip input mechanism.

7. The apparatus as claimed in claim 6, wherein an wafer ID is used to control the flow of a wafer between different systems.

8. The apparatus as claimed in claim 6, wherein a wafer is carried from one system to a next system by a wafer cassette.

9. The apparatus as claimed in claim 6, wherein said first and second wafer sorting systems and said final testing system each comprises a prober for performing wafer level burn-in.

10. The apparatus as claimed in claim 6, further comprising a world wide internet connection for transmitting output data to a client.

11. The apparatus as claimed in claim 6, wherein each system receives input information including wafer mapping and yield data from a server and sends output information including wafer mapping and yield data to said server.

* * * * *